United States Patent [19]
Schuele et al.

[11] Patent Number: 6,093,615
[45] Date of Patent: Jul. 25, 2000

[54] METHOD OF FABRICATING A CONTACT STRUCTURE HAVING A COMPOSITE BARRIER LAYER BETWEEN A PLATINUM LAYER AND A POLYSILICON PLUG

[75] Inventors: Paul J. Schuele; Pierre C. Fazan, both of Boise, Id.

[73] Assignee: Micron Technology, Inc., Boise, Id.

[21] Appl. No.: 08/290,655

[22] Filed: Aug. 15, 1994

[51] Int. Cl.$^7$ .................................................. H01L 21/20
[52] U.S. Cl. ..................... 438/396; 438/627; 438/648; 438/653; 438/657; 438/685; 438/680; 438/681; 257/751; 257/768; 361/303; 361/305
[58] Field of Search ..................... 437/187, 190, 437/192, 201, 52, 60; 257/751, 752, 761, 763, 306, 310, 768; 438/396, 627, 648, 653, 680–681, 656, 657, 685; 361/303, 305

[56] References Cited

U.S. PATENT DOCUMENTS

| | | | |
|---|---|---|---|
| 5,089,438 | 2/1992 | Katz | 437/190 |
| 5,136,362 | 8/1992 | Grief et al. | 257/763 |
| 5,246,881 | 9/1993 | Sandhu et al. | 437/192 |
| 5,252,518 | 10/1993 | Sandhu et al. | 437/200 |
| 5,254,499 | 10/1993 | Sandhu et al. | 437/192 |
| 5,258,096 | 11/1993 | Sandhu et al. | 437/52 |
| 5,292,677 | 3/1994 | Dennison | 437/52 |
| 5,335,138 | 8/1994 | Sandhu et al. | 437/60 |
| 5,336,629 | 9/1994 | Dhong et al. | 437/52 |
| 5,344,792 | 9/1994 | Sandhu et al. | 437/200 |
| 5,381,302 | 1/1995 | Sandhu et al. | 257/310 |
| 5,571,572 | 11/1996 | Sandhu | 427/585 |

FOREIGN PATENT DOCUMENTS 1-266718  10/1989  Japan .

OTHER PUBLICATIONS

IBM Technical Disclosure Bulletin, vol. 35, No. 5, pp. 456–459, Oct. 1992.

*Primary Examiner*—John F. Niebling
*Assistant Examiner*—Ha Tran Nguyen
*Attorney, Agent, or Firm*—Trask, Britt & Rossa

[57] ABSTRACT

This invention is a process for forming an effective titanium nitride barrier layer between the upper surface of a polysilicon plug formed in thick dielectric layer and a platinum lower capacitor plate in a dynamic random access memory which is being fabricated on a silicon wafer. The barrier layer process begins by etching the upper surface of the polysilicon plug using a selective polysilicon etch until it is recessed at least 1000 Å below the upper surface of the thick dielectric layer. Using a collimated sputter source, a titanium layer having a thickness of 100–500 Å is deposited over the surface of the in-process wafer, thus covering the upper surfaces of the polysilicon plugs. A layer of amorphous titanium carbonitride having a thickness of 100–300 Å is then deposited via low-pressure chemical vapor deposition. This is followed by the deposition of a reactively sputtered titanium nitride layer having a thickness of 1000–2000 Å. The wafer is then planarized to remove the titanium, titanium carbonitride and titanium nitride, except that which is in the recesses on top of the silicon plugs. The wafer is then annealed in nitrogen to react the titanium layer with the silicon on the upper surfaces of the plugs to form titanium silicide. A platinum layer is then deposited and patterned to form lower capacitor electrodes which are electrically coupled to the polysilicon plugs through the titanium silicide, titanium nitride and titanium carbonitride layers.

12 Claims, 3 Drawing Sheets

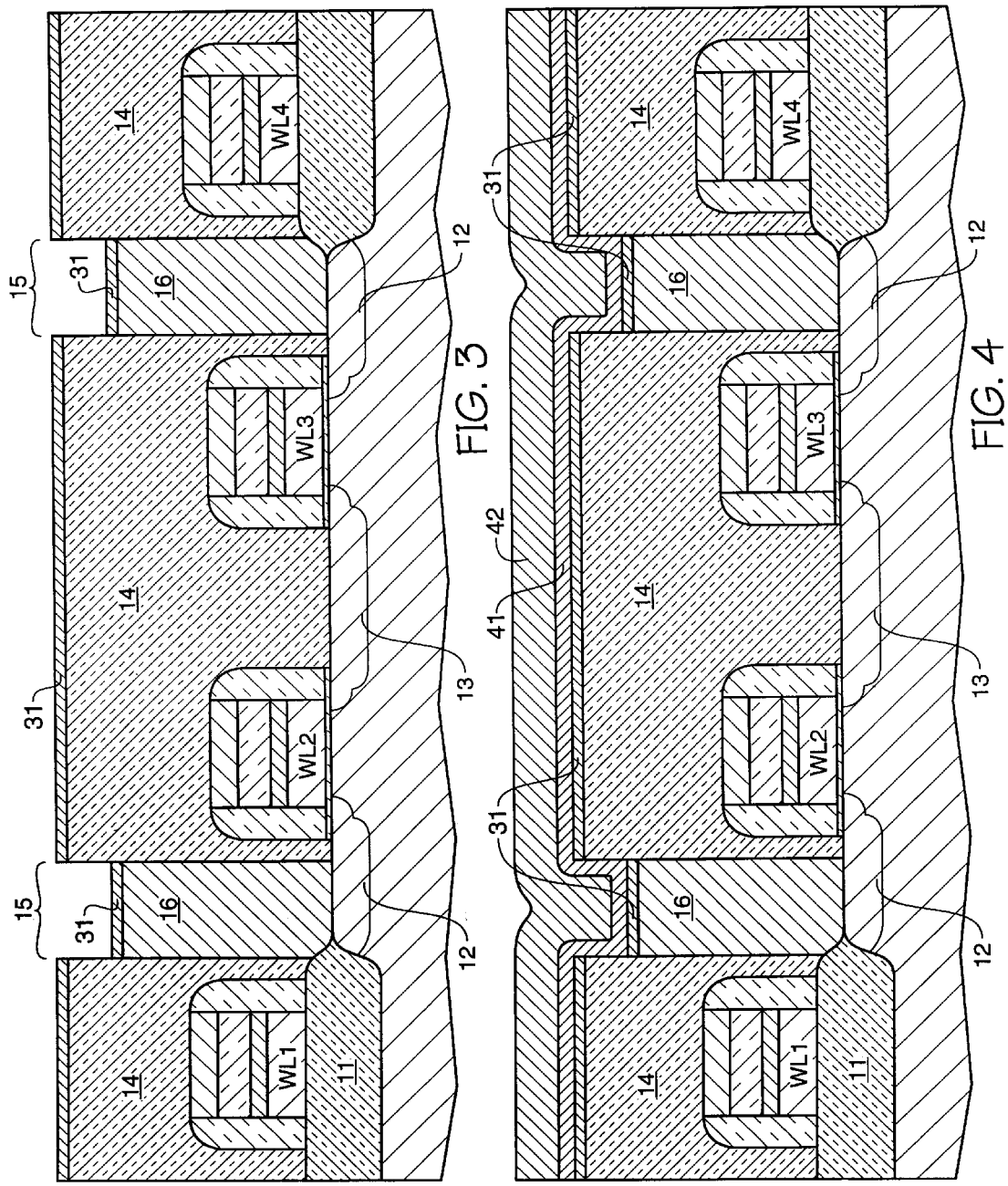

METHOD OF FABRICATING A CONTACT STRUCTURE HAVING A COMPOSITE BARRIER LAYER BETWEEN A PLATINUM LAYER AND A POLYSILICON PLUG

FIELD OF THE INVENTION

This invention relates to the manufacture of integrated circuits and, more specifically, to barrier films which are employed to prevent atomic and ionic migration between two adjacent layers which must be conductively coupled.

BACKGROUND OF THE INVENTION

For a particular design of an ultra-high-density dynamic random access memory, the integration of a capacitor having a high-permittivity dielectric layer in a CMOS process flow requires that contact be made between a platinum lower capacitor plate and a polycrystalline silicon (polysilicon) plug which makes contact to the storage node junction of the cell access transistor. The dielectric layer, which may be a perovskite oxide such as barium strontium titanate, is deposited at high temperatures in an ambient oxygen.

There are two problems inherent to the dielectric deposition process. The first problem is that the high temperature required for the deposition will initiate a reaction between platinum and silicon, thus consuming the platinum capacitor plate and contaminating the capacitor with silicon. It is, therefore necessary to utilize an electrically conductive diffusion barrier between the platinum and the polysilicon. The second problem is that oxygen will diffuse through the platinum layer and form an insulative silicon dioxide layer between the polysilicon plug and the platinum layer. In such a case, the lower plate of the capacitor will not be in electrical contact with the storage-node junction. Thus the diffusion barrier must also be impermeable to oxygen.

Reactively sputtered titanium nitride has been used extensively as a barrier layer in integrated circuits. However, reactively sputtered titanium nitride has a crystalline structure and does not exhibit good step coverage-particularly in deep contact openings. The crystal boundaries associated with such a structure tend to promote ionic and atomic migration. Given this fact, the polysilicon plugs will not be sufficiently protected from reaction with the platinum capacitor plate or with oxygen.

Titanium nitride deposited via low-pressure chemical vapor deposition (LPCVD) using tetrakis-dimethylamidotitanium or related compounds as the sole precursor is an amorphous material, having no crystal structure and, therefore, no crystal grain boundaries to facilitate atomic and ionic diffusion. However, titanium nitride films deposited via LPCVD have a high carbon content. From X-Ray spectrographic analysis, it appears that some of the carbon atoms have reacted with the titanium to form titanium carbide. The balance of the carbon atoms appears to be unreacted, but trapped, nevertheless, in the titanium nitride/titanium carbide matrix. It is hypothesized that a crystalline structure fails to form because the presence of carbon interferes with crystal nucleation. The presence of carbon, though likely responsible for the amorphous structure of the film (a beneficial quality), is also problematic, as it greatly increases the sheet resistance of the film. In addition, when the carbon-containing films are subjected to high temperatures in the presence of oxygen, the films become perforated and, hence, worthless as barrier films. The perforation phenomenon may be caused by the explosive formation of carbon dioxide gas within the film.

What is needed is a way to combine the beneficial qualities of both reactively-sputtered titanium nitride with those of titanium nitride deposited via LPCVD.

SUMMARY OF THE INVENTION

This invention is a process for forming an effective titanium nitride barrier layer between the upper surface of a polysilicon plug and a platinum lower capacitor plate in a dynamic random access memory. The memory, which is fabricated on a silicon wafer or substrate, has insulated gate field effect cell access transistors with polysilicon gates which may have a layer of a refractory metal silicide (e.g., tungsten silicide) on their upper surfaces to lower sheet resistance. The transistors are covered with a planarized, thick, flowably deposited dielectric layer such as boro-phosphosilicate glass (BPSG). A via or contact opening is etched through the thick dielectric layer (the term "thick" is employed merely to distinguish this dielectric layer from the subsequently-deposited capacitive dielectric layer) to the storage-node junction of each access transistor, and each of these openings is filled with a polysilicon plug. To begin the barrier layer formation process, the upper surface of each polysilicon plug is recessed at least 1000 Å below the upper surface of the thick dielectric layer using a selective polysilicon etch. Using a collimated sputter source, a titanium layer having a thickness of 100–500 Å is deposited over the surface of the in-process wafer, thus covering the upper surfaces of the polysilicon plugs. A layer of amorphous titanium carbonitride having a thickness of 100–300 Å is then deposited via low-pressure chemical vapor deposition. This is followed by the deposition of a reactively sputtered titanium nitride layer having a thickness of 1000–2000 Å. The wafer is then planarized using chemical mechanical polishing (CMP) to remove the titanium, titanium carbonitride and titanium nitride, except that which is in the recesses on top of the silicon plugs. The wafer is then annealed in nitrogen using a rapid thermal anneal system to react the titanium layer with the silicon on the upper surfaces of the plugs to form titanium silicide. The anneal step also repairs damage sustained by the titanium nitride layer during the CMP step. A platinum layer is then deposited and patterned to form lower capacitor electrodes which are electrically coupled to the polysilicon plugs through the titanium silicide, titanium nitride and titanium carbonitride layers. A high permittivity capacitor dielectric layer is then deposited and the capacitors are completed by depositing an upper cell plate layer. The memory is then completed in a conventional manner.

BRIEF DESCRIPTION OF THE DRAWINGS

FIG. 3 is a cross-sectional view of the portion of the in-process DRAM array of FIG. 2 following the deposition of a platinum metal layer;

FIG. 4 is a cross-sectional view of the portion of the in-process DRAM array of FIG. 3 following the formation of a titanium carbonitride layer via low-pressure chemical vapor deposition and the subsequent deposition of a titanium nitride layer via reactive sputtering;

PREFERRED EMBODIMENT OF THE INVENTION

Figure 1:
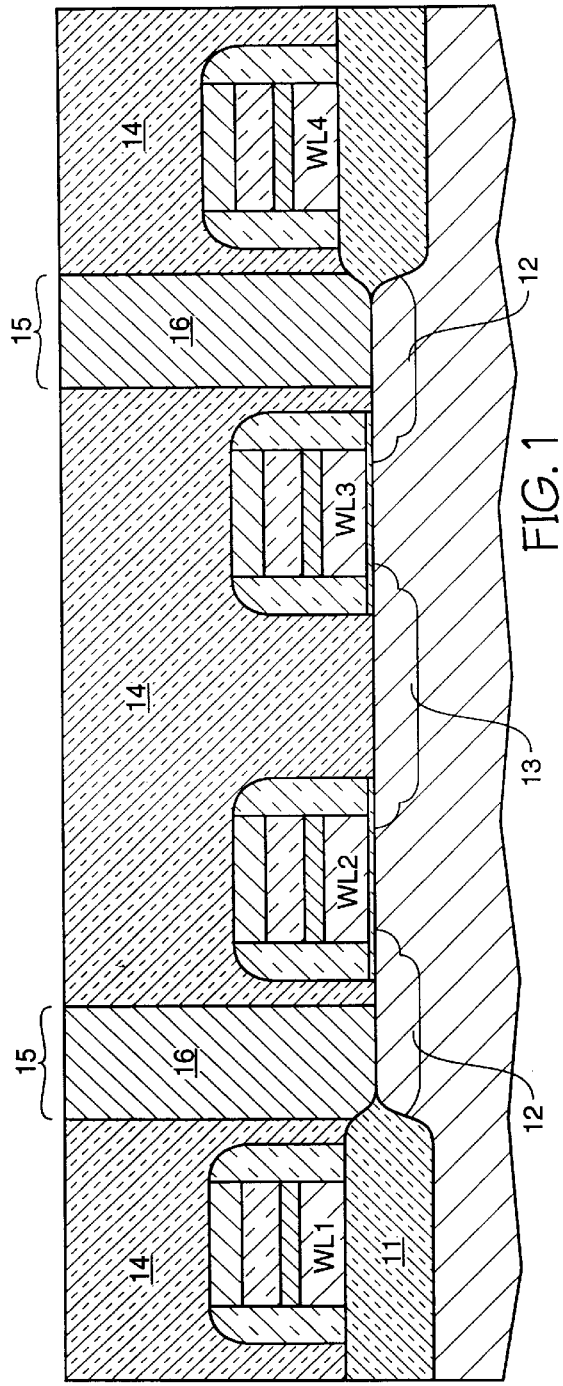
FIG. 1, a cross-sectional view of a portion of an in-process semiconductor wafer, depicts a portion of a dynamic random access memory (DRAM) array following field oxidation, wordline formation, source/drain implants, deposition of a thick dielectric layer, and polysilicon plug formation.

Referring now to FIG. 1, a portion of an in-process dynamic random access memory (DRAM) array is shown following a field oxidation step which formed field oxide regions 11, the deposition and patterning of a polysilicon layer to form wordlines WL1–WL4, source/drain implants which have formed storage-node junctions 12 and bitline contact junctions 13, the deposition of a thick, flowable dielectric layer (e.g., borophosphosilicate glass) 14 which covers substrate-superjacent topography such as wordlines and field oxide regions, the formation of contact openings 15 in the thick dielectric layer 14 which expose the storage-node junctions 12, filling the contact openings with polysilicon material, and planarization of the wafer to form polysilicon plugs 16.

Figure 2:
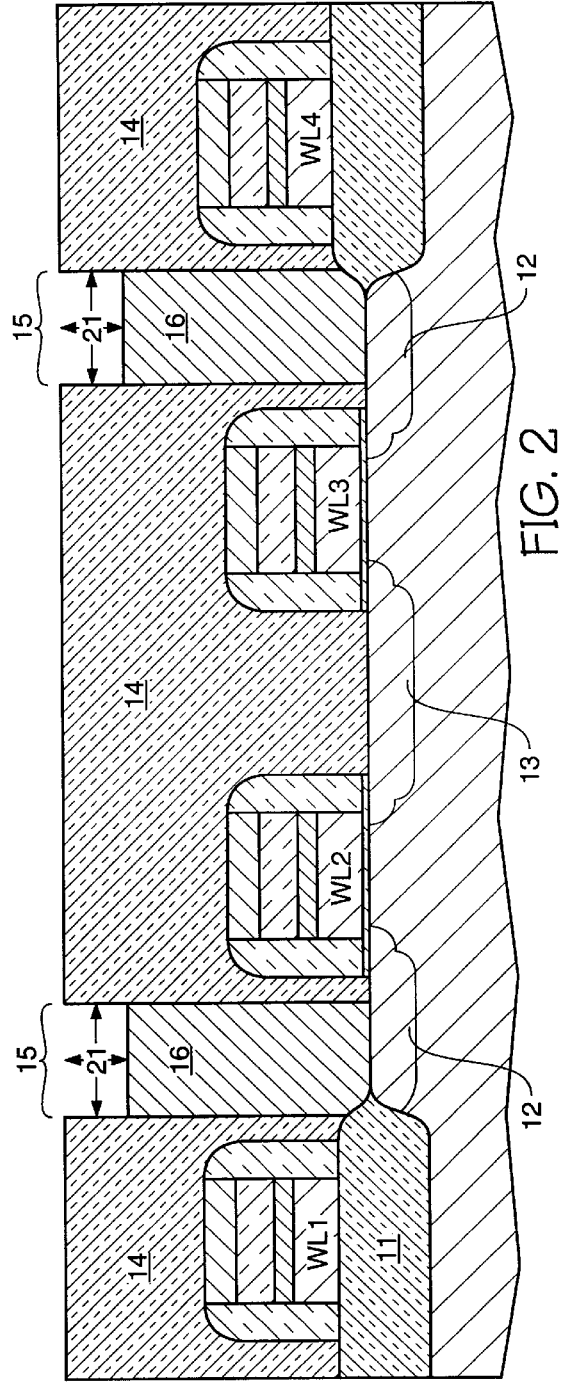
FIG. 2 is a cross-sectional view of the portion of the in-process DRAM array of FIG. 1 following an etch selective for polysilicon which has recessed the upper surface of each plug below the upper surface of the thick dielectric layer.

Referring now to FIG. 2, the polysilicon plugs 16 have been recessed within the contact openings 15 by performing an etch step that is selective for polysilicon, thus forming a well 21 in the thick dielectric layer above each plug. The etch is allowed to proceed until the plugs are recessed at least 1000 Å below the upper surface of the thick dielectric layer 14.

Referring now to FIG. 3, a titanium metal layer 31 is deposited on the upper surface of the wafer to a thickness of 100–500 Å using a collimated sputter source.

Referring now to FIG. 4, a titanium carbonitride layer 41 having a thickness of 100–300 Å is deposited on the upper surface of the wafer via low-pressure chemical vapor deposition (LPCVD). Although the compound is referred to as titanium carbonitride (represented by the chemical formula $TiC_xN_y$), the stoichiometry of the compound is variable, depending on the conditions under which it is deposited. Its primary constituents are titanium and nitrogen, with the ratio of nitrogen to carbon being within a range of 5:1 to 20:1 for the process disclosed herein. X-Ray spectrographic analysis indicates that in these films, some of the carbon atoms have reacted with the titanium to form titanium carbide. The balance of the carbon atoms appear to be unreacted, but trapped nevertheless in the titanium nitride/titanium carbide matrix. It is hypothesized that a crystalline structure fails to form because the presence of carbon interferes with crystal nucleation.

Deposition of the titanium carbonitride layer 41 takes place in a low-pressure chamber (i.e, a chamber in which pressure has been reduced to between 0.1 and 100 Torr prior to deposition), and utilizes a metal-organic tetrakis-dialkylamido-titanium compound as the sole precursor. Any noble gas, as well as nitrogen or hydrogen, or a mixture of two or more of the foregoing may be used as a carrier for the precursor compound. The wafer is heated to a temperature within a range of 200–600° C. Precursor molecules which contact the heated wafer are pyrolyzed to form titanium nitride containing variable amounts of carbon impurities, which deposits as a highly conformal film on the wafer. Although the carbon impurities present in the deposited films dramatically increase the sheet resistivity of the film, this increase in resistivity is relatively insignificant due to the relative thinness of the deposited layer. The carbon content of the barrier film may be minimized by utilizing tetrakis-dimethylamido-titanium, $Ti(NMe_2)_4$, as the precursor, rather than compounds, such as tetrakis-diethylamido-titanium or tetrakis-dibutylamido-titanium, which contain a higher percentage of carbon by weight.

Still referring to FIG. 4, the deposited titanium carbonitride layer 41 demonstrates excellent step coverage, a high degree of conformality, and an acceptable level of resistivity. Subsequent to the deposition of the titanium carbonitride layer 41, a titanium nitride layer 42 having a thickness of 1000–2000 Å is deposited on top of the titanium carbonitride layer 41 via reactive sputtering. Titanium nitride layers deposited via reactive sputtering normally do not exhibit good step coverage. Thus, most of the deposition occurs only on horizontal surfaces.

Figure 5:
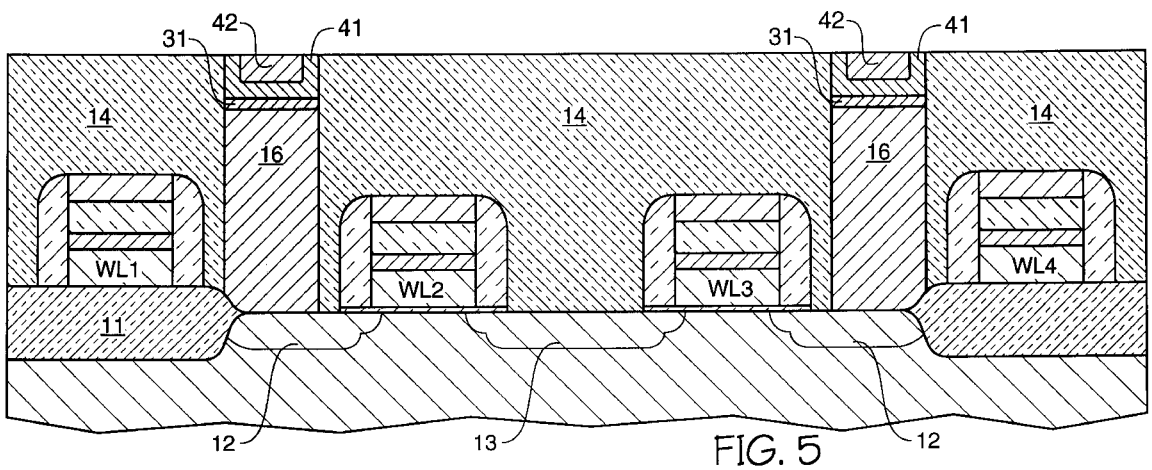
FIG. 5 is a cross-sectional view of the portion of the in-process DRAM array of FIG. 4 following a planarization step.

Referring now to FIG. 5, the wafer is planarized to remove the titanium, titanium carbonitride and titanium nitride, except that which is in the recesses on top of the silicon plugs 16.

Figure 6:
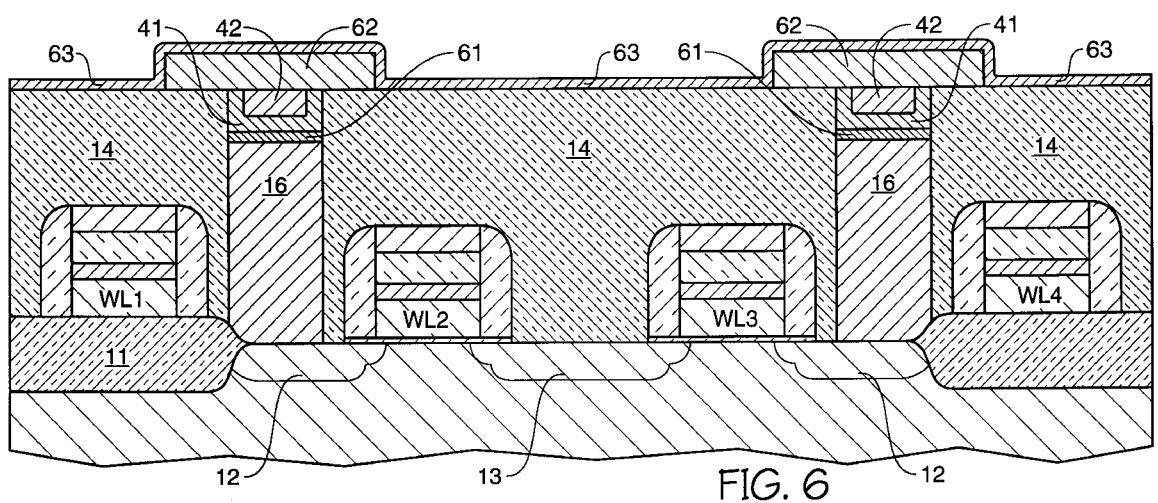
FIG. 6 is a cross-sectional view of the portion of the in-process DRAM array of FIG. 5 following the deposition and patterning of a platinum metal layer and the subsequent deposition of a high-permittivity dielectric layer.

Referring now to FIG. 6, the wafer has been subjected to an anneal step using a rapid thermal anneal system to react the titanium metal layer 31 (FIG. 3) with the silicon on the upper surfaces of the plugs 16 to form titanium silicide 61. If the silicidation reaction is not allowed to proceed to completion, there will be a titanium metal layer on top of the titanium silicide layer 61. The anneal step also repairs damage sustained by the titanium nitride layer 42 during the CMP step. Subsequent to the anneal step, a platinum metal layer is deposited on the upper surface of the wafer and patterned to form lower capacitor electrodes 62. A high permittivity capacitor dielectric layer 63 is then deposited on the upper surface of the wafer. The capacitor dielectric layer 63, which may be a perovskite oxide such as barium strontium titanate or strontium titanate, is deposited at high temperatures in an ambient oxygen. The titanium nitride layer 42 of the bi-layer barrier film that has been fabricated prevents oxygen from diffusing to the titanium carbonitride layer 41, where it would attack free carbon atoms and cause perforations in the barrier layer. Likewise, the titanium carbonitride layer 41, because it is an amorphous material without crystal grain boundaries, is able to prevent the migration of silicon atoms to the titanium nitride layer 42 through which it would be able to diffuse to reach the overlying platinum lower capacitor electrodes 62. The cell capacitors are completed by depositing an upper cell plate layer (not shown). The memory is then completed in a conventional manner.

Although only a single embodiment of the invention has been described in detail, it will be obvious to those having ordinary skill in the art of integrated circuit manufacture that changes and modifications may be made thereto without departing from the spirit and the scope of the invention as hereinafter claimed. For example, the invention may also be practiced in the context of a dynamic random access memory array having a buried bitline architecture, in which bit lines (also known as digit lines) are formed after word line formation, but before cell capacitor formation. Thus the general process flow depicted is meant to be only illustrative and not limiting.

What is claimed is:

1. A process for forming a barrier film within an integrated circuit undergoing fabrication on a silicon wafer, the circuit having at least one polysilicon plug which penetrates a dielectric layer overlying substrate-superadjacent topography to make contact to a transistor junction in the substrate, the process comprising:

recessing an upper surface of the polysilicon plug below the upper surface of the dielectric layer forming a well within the dielectric layer, the well extending above the upper surface of the plug;

depositing a titanium metal layer on the upper surface of the plug;

providing a low-pressure chemical vapor deposition apparatus;

placing said integrated circuit undergoing fabrication on said silicon wafer in the low-pressure chemical vapor deposition chamber;

providing an atmosphere in said low-pressure chemical vapor deposition chamber having a pressure in the range between 0.1 Torr to 100 Torr, the atmosphere comprising a mixture of at least two gases from the group consisting of a noble gas, nitrogen gas, and hydrogen gas;

providing an organo-metallic precursor compound in the low-pressure chemical vapor deposition chamber;

heating said integrated circuit undergoing fabrication on said silicon wafer in the low-pressure chemical vapor deposition chamber to a temperature in the range between 200° C. to 600° C.;

depositing an amorphous layer of titanium carbonitride having an amorphous structure substantially without crystal grain boundaries therein within the well of said integrated circuit undergoing fabrication on said silicon wafer in the low-pressure chemical varpor deposition chamber having the atmosphere located therein comprising a mixture of at least two gases from the group consisting of a noble gas, nitrogen gas, and hydrogen gas, the atmosphere having a pressure in the range of between 0.1 Torr to 100 Torr, by a low-pressure chemical vapor deposition process using the organo-metallic precursor compound located in the low-pressure chemical vapor deposition chamber, the molecules of the organo-metallic precursor compound contacting said integrated circuit undergoing fabrication on said wafer forming an amorphous layer thereon including titanium nitride having carbon impurities therein in an amorphous structure substantially without crystal grain boundaries therein;

depositing a titanium nitride layer within the well so as to at least cover horizontal portions of the titanium carbonitride layer; and planarizing the wafer to remove titanium metal, titanium carbonitride and titanium nitride except that which is within the well.

2. The process of claim 1, wherein the silicon wafer is subjected to an anneal step to convert at least a portion of the titanium metal layer to titanium silicide.

3. The process of claim 1, wherein said well is at least 1500 Å deep.

4. The process of claim 1, wherein said titanium carbonitride layer has a thickness of 100–300 Å.

5. The process of claim 1, wherein said organometallic precursor compound is tetrakis-dialkylamido titanium.

6. The process of claim 5, wherein the tetrakis-dialkylamido titanium compound is tetrakis-dimethylamido titanium.

7. The process of claim 1, wherein the titanium nitride layer is deposited via reactive sputtering and has a thickness of 1000–2000 Å.

8. The process of claim 1, wherein planarization of the silicon wafer is accomplished using chemical mechanical polishing.

9. The process of claim 1, which further comprises the steps of:

depositing a platinum layer on top of the dielectric layer and on top of the titanium nitride layer within the well;

patterning the platinum layer to form a lower capacitor electrode; and depositing a perovskite oxide capacitor dielectric layer on exposed surfaces of the lower capacitor electrode.

10. The process of claim 9, wherein said perovskite oxide capacitor dielectric is barium strontium titanate.

11. The process of claim 9, wherein said perovskite oxide capacitor dielectric is strontium titanate.

12. A process for forming a barrier film within an integrated circuit undergoing fabrication on a silicon wafer, the circuit having at least one polysilicon plug which penetrates a dielectric layer overlying substrate-superadjacent topography to make contact to a transistor junction in the substrate, the process comprising:

recessing an upper surface of the polysilicon plug below the upper surface of the dielectric layer forming a well within the dielectric layer, the well extending above the upper surface of the plug;

depositing a titanium metal layer on the upper surface of the plug;

providing a low-pressure chemical vapor deposition apparatus;

placing said integrated circuit undergoing fabrication on said silicon wafer in the low-pressure chemical vapor deposition chamber;

providing an atmosphere in said low-pressure chemical vapor deposition chamber having a pressure in the range between 0.1 Torr to 100 Torr, the atmosphere comprising a mixture of at least two gases from the group consisting of a noble gas, nitrogen gas, and hydrogen gas;

providing an organo-metallic precursor compound in the low-pressure chemical vapor deposition chamber;

heating said integrated circuit undergoing fabrication on said silicon wafer in the low-pressure chemical vapor deposition chamber to a temperature in the range between 200° C. to 600° C.;

depositing an amorphous layer of titanium carbonitride having an amorphous structure substantially without crystal grain boundaries therein within the well of said integrated circuit undergoing fabrication on said silicon wafer in the low-pressure chemical vapor deposition chamber having the atmosphere located therein comprising a mixture of at least two gases from the group consisting of a noble gas, nitrogen gas, and hydrogen gas, the atmosphere having a pressure in the range of between 0.1 Torr to 100 Torr, by a low-pressure chemical vapor deposition process using the organo-metallic precursor compound located in the low-pressure chemical vapor deposition chamber, the molecules of the organo-metallic precursor compound contacting said integrated circuit undergoing fabrication on said silicon wafer forming an amorphous layer thereon including titanium nitride having carbon impurities therein in an amorphous structure substantially without crystal grain boundaries therein;

depositing a titanium nitride layer within the well so as to at least cover horizontal portions of the titanium carbonitride layer, the titanium metal layer deposited by collimated sputtering and has a thickness in the range of between 100–500 Å; and planarizing the silicon wafer to remove titanium metal, titanium carbonitride and titanium nitride except that which is within the well.

* * * * *

UNITED STATES PATENT AND TRADEMARK OFFICE
CERTIFICATE OF CORRECTION

PATENT NO. : 6,093,615  
DATED : July 25, 2000  
INVENTOR(S) : Schuele et al.

It is certified that error appears in the above-identified patent and that said Letters Patent is hereby corrected as shown below:

Title page,
Item [57], ABSTRACT,
Line 3, after "in" insert -- a --.

Column 1,
Line 5, insert -- Government Rights:  This invention was made with United States Government support under Contract No. MDA972-92-C-0033 awarded by the Advanced Research Projects Agency (ARPA). The United States Government has certain rights in this invention. --;
Line 19, delete "an";
Line 22, after "a" insert -- silicidation --;
Line 25, after "therefore" insert -- , --;
Line 31, after "Thus" insert -- , --;
Line 36, after "coverage" delete "-" and insert -- , -- therefor;

Column 3,
Line 7, change "substrate-superjacent" to -- substrate-superadjacent --;
Line 10, after "openings" insert -- 15 --;
Line 16, after "layer" insert -- 14 --;
Line 46, after "foregoing" insert -- , --;

Column 4,
Line 20, delete "an";
Line 40, change "bitline" to -- bit line --;
Line 42, after "Thus" insert -- , --;
Line 52, after "the" insert -- at least one --;
Lines 55 and 57, after "the" insert -- at least one polysilicon --;
Lines 62 and 64, change "chamber" to -- apparatus --;
Line 66, change "the" to -- a --;
Line 70, change "chamber" to -- apparatus --;

Column 5,
Lines 3 and 10, change "chamber" to -- apparatus --;
Line 9, change "varpor" to -- vapor --;
Line 11, change "a" to -- said --;
Line 13, change "a" to -- the --;
Line 17, change "chamber" to -- apparatus -- and delete "the";
Lines 20 and 21, change "an" to -- said --;
Line 27, change "titanium metal, titanium" to -- said titanium metal layer, said titanium --;

UNITED STATES PATENT AND TRADEMARK OFFICE
CERTIFICATE OF CORRECTION

PATENT NO. : 6,093,615
DATED : July 25, 2000
INVENTOR(S) : Schuele et al.

It is certified that error appears in the above-identified patent and that said Letters Patent is hereby corrected as shown below:

Column 5 cont'd,
Line 28, change "carbonitride and titanium nitride" to -- carbonitride layer and said titanium nitride layer --;
Line 40, delete "compound";
Line 45, after "wherein" insert -- said --;
Lines 57 and 59, after "dielectric" insert -- layer --;

Column 6,
Line 7, after "the" insert -- at least one --;
Lines 10 and 12, after "the" insert -- at least one polysilicon --;
Lines 17 and 19, change "chamber" to -- apparatus --;
Line 21, change "the" to -- a --;
Lines 25, 28 and 35, change "chamber" to -- apparatus --;
Line 36, change "a" to -- said --;
Line 38, change "a" to -- the --;
Line 42, change "chamber" to -- apparatus -- and delete "the";
Lines 45 and 47, change "an" to -- said --;
Line 52, change "has" to -- having --;
Line 54, change "titanium metal," to -- said titanium metal layer, -- and
Line 55, insert -- said -- before "titanium" (both occurrences), after "carbonitride" insert -- layer -- and after "nitride" insert -- layer --.

Signed and Sealed this

Twenty-eighth Day of October, 2003

JAMES E. ROGAN
*Director of the United States Patent and Trademark Office*